(12) United States Patent
Fuchs

(10) Patent No.: US 10,310,096 B2
(45) Date of Patent: Jun. 4, 2019

(54) DEVICE AND METHOD FOR DETECTING RADIATION

(71) Applicant: Alfred Fuchs, Bergen (DE)

(72) Inventor: Alfred Fuchs, Bergen (DE)

( * ) Notice: Subject to any disclaimer, the term of this patent is extended or adjusted under 35 U.S.C. 154(b) by 0 days.

(21) Appl. No.: 15/742,207

(22) PCT Filed: Jun. 30, 2016

(86) PCT No.: PCT/EP2016/065328
§ 371 (c)(1),
(2) Date: Jan. 5, 2018

(87) PCT Pub. No.: WO2017/005602
PCT Pub. Date: Jan. 12, 2017

(65) Prior Publication Data
US 2019/0072675 A1    Mar. 7, 2019

(30) Foreign Application Priority Data
Jul. 7, 2015    (AT) .................................. 50587/2015

(51) Int. Cl.
*G01T 1/17*    (2006.01)
*G01T 1/16*    (2006.01)
(Continued)

(52) U.S. Cl.
CPC .............. *G01T 1/1606* (2013.01); *G01T 1/17* (2013.01); *B82Y 10/00* (2013.01); *H01L 39/10* (2013.01)

(58) Field of Classification Search
CPC ......... G01T 1/1606; G01T 1/17; B82Y 10/00; H01L 39/10
See application file for complete search history.

(56) References Cited

U.S. PATENT DOCUMENTS 6,455,849 B1    9/2002    Hilton et al.
7,589,323 B2 *  9/2009    Tanaka ................... G01N 23/00
                                                        250/310

(Continued)

FOREIGN PATENT DOCUMENTS

WO    2004023123 A1    3/2004
WO    2010047844 A2    4/2010

OTHER PUBLICATIONS

J. Clarke et al., "Superconductive bolometers for submillimeter wavelengths", Journal of Applied Physics Phys. Sci. Instrum, Apr. 1977.

(Continued)

*Primary Examiner* — Marcus H Taningco
(74) *Attorney, Agent, or Firm* — McKee, Voorhees & Sease, PLC

(57) ABSTRACT

An apparatus (7) for detecting radiation, preferably x-ray radiation, the apparatus comprising at least one detector element (11) which comprises an absorber element (1) for the radiation and a nanowire (2) made of a superconducting material in thermally conducting communication with the absorber element (1), wherein cooling means (34) are provided in order to cool the absorber element (1) and the nanowire (2) to a temperature in the range of the transition temperature of the nanowire (2) in an operating state of the apparatus (7) and wherein an evaluation and control unit (6) is provided to determine whether the nanowire (2) is in a superconducting state or not. According to the invention it is provided that at least one heating means (8) which can be controlled by means of the evaluation and control unit (6) is provided in order to be able to supply a thermal energy pulse to the absorber element (1), wherein the evaluation and control unit (6) is designed to continuously supply energy pulses to the absorber element (1) in the operating state of the apparatus (7) as long as the nanowire (2) is in the superconducting state.

30 Claims, 5 Drawing Sheets

(51) Int. Cl.
 *H01L 39/10* (2006.01)
 *B82Y 10/00* (2011.01)

(56) References Cited

U.S. PATENT DOCUMENTS

| | | | | |
|---|---|---|---|---|
| 2005/0184238 | A1* | 8/2005 | Odawara | G01T 1/1606 |
| | | | | 250/336.2 |
| 2008/0276979 | A1* | 11/2008 | Lagally | H01L 29/0665 |
| | | | | 136/239 |
| 2013/0150245 | A1* | 6/2013 | Smith | G01J 5/023 |
| | | | | 505/160 |
| 2013/0172195 | A1 | 7/2013 | Bellei et al. | |
| 2013/0174900 | A1 | 7/2013 | Farris, III et al. | |
| 2014/0087952 | A1* | 3/2014 | Nam | G01J 1/42 |
| | | | | 505/181 |
| 2014/0353476 | A1* | 12/2014 | Bachar | H01L 39/16 |
| | | | | 250/227.24 |

OTHER PUBLICATIONS

"Search Report of Austrian Patent Office", (2 pgs) dated Feb. 5, 2016.
"International Search Report", PCT/EP2016/065328, 2 pages, dated Sep. 7, 2016.
"Written Opinion of International Search Authority", PCT/EP2016/065328 dated Jan. 1, 2017.

* cited by examiner

DEVICE AND METHOD FOR DETECTING RADIATION

CROSS-REFERENCE TO RELATED APPLICATION

This application claims benefit under 35 U.S.C. § 119 or § 120 to Austrian application Ser. No. AT A 50587/2015 filed Jul. 7, 2015.

FIELD OF THE INVENTION

The present invention relates to an apparatus for detecting radiation, preferably x-ray radiation, the apparatus comprising at least one detector element which comprises an absorber element for the radiation and a nanowire made of a superconducting material in thermally conducting communication with the absorber element, wherein cooling means are provided in order to cool the absorber element and the nanowire of the at least one detector element to a temperature in the range of the transition temperature of the nanowire in an operating state of the apparatus and wherein an evaluation and control unit is provided to determine whether the nanowire of the at least one detector element is in a superconducting state or not.

The present invention further relates to a method for detecting radiation, preferably x-ray radiation, wherein an absorber element and a nanowire made of a superconducting material in thermally conducting communication with the absorber element are cooled to a temperature in the range of the transition temperature of the nanowire, wherein the radiation is absorbed by means of the absorber element and wherein it is continuously determined whether the nanowire is in a superconducting state or not.

RELATED ART

X-rays are used for analytical purposes in most diverse areas of technology as well as in medicine. In this case it is generally desirable to increase the detection sensitivity of detectors for x-rays in order to improve an attainable spatial resolution and/or to reduce the dose burden for an object being investigated. The latter is important particularly in the medical area since high dose burdens can result in health impairments of patients. Here particular mention should be made of computer tomography and mammography. In the former case a high overall dose carries negative weight, in the latter case routine repetition has the result that a too-high overall dose is obtained in the course of time.

Previously x-ray detectors were mostly used which utilized ionization of xenon gas caused by x-rays to measure the x-rays. Nowadays, primarily scintillation detectors are used whose detection sensitivity is substantially determined by the choice of scintillator material.

In principle however, the optimization of detectors naturally not only for x-ray radiation but also for most diverse types of radiation plays a role in most diverse areas of technology as well as in medicine.

Detectors are known from astronomy, e.g. primarily for the measurement of electromagnetic radiation in the optical and infrared ranges which operate at very low temperatures and which are desired as calorimeters or bolometers. In this case, the amount of energy or power which is deposited by the radiation in an absorber is measured. As a result of the low temperatures, superconducting materials can be used as absorbers which are initially held just below the transition temperature and are heated by the absorbed radiation above the transition temperature, wherein the sharp transition between superconduction and normal conduction is used for detection. Attainable temporal resolutions are typically in the ms range or just below, which is too slow particularly for medical computer tomography applications.

OBJECT OF THE INVENTION

It is therefore the object of the present invention to provide an apparatus and a method which enable a rapid and extremely sensitive detection of radiation, in particular x-ray radiation, in order to improve an attainable spatial resolution when investigating an object to be investigated and/or to reduce a dose burden for the object to be investigated.

BRIEF SUMMARY OF THE INVENTION

The essence of the invention is the linking of the principle of a delta sigma analog-digital converter (sigma delta ADC) or delta sigma converter to elements of bolometers known from astronomy. In this case, superconducting elements are used and the striking transition between superconduction and normal conduction is used for detection. As a result of the use of superconducting elements for detection, an extremely high quantum efficiency can be achieved. Specifically in an apparatus for detecting radiation, preferably x-ray radiation, the apparatus comprising at least one detector element which comprises an absorber element for the radiation and a nanowire made of a superconducting material in thermally conducting communication with the absorber element, wherein cooling means are provided in order to cool the absorber element and the nanowire of the at least one detector element to a temperature in the range of the transition temperature of the nanowire in an operating state of the apparatus and wherein an evaluation and control unit is provided to determine whether the nanowire of the at least one detector element is in a superconducting state or not, it is provided according to the invention that at least one heating means which can be controlled by the evaluation and control unit is provided in order to be able to supply a thermal energy pulse to the absorber element of the at least one detector element, wherein the evaluation and control unit is designed to continuously supply energy pulses to the absorber element of the at least one detector element in the operating state of the apparatus as long as the nanowire of the at least one detector element is in the superconducting state.

The nanowire can adopt two states: superconducting or "high-resistance", wherein the transition between these two states takes place very rapidly with reaction times in the range of 1 ns or even less than 1 ns. Since energy is supplied continuously to the absorber element by means of the heating means in small increments, the temperature of the absorber element is successively increased in small increments even without the presence of radiation to be detected. As a result of the thermally conducting connection to the nanowire, its temperature is therefore also continuously increased in small increments until a change in the state of the nanowire comes about. As soon as the nanowire is high-resistance, no more energy pulses are supplied whereupon the absorber element cools down again as a result of the cooling means. The energy input of a possible measurement current through the nanowire is negligible in this case or can be corrected by calibration. As a result, the nanowire becomes superconducting again when this falls below the transition temperature.

The power which is required to bring the absorber element to that temperature level at which the nanowire is located on average specifically at the transition temperature can be calculated directly from the sequence of pulses.

If radiation additionally impinges upon the absorber element, accordingly fewer energy pulses must be supplied to the absorber element by means of the heating element since the absorbed radiation also results in an increase in the temperature of the absorber element in small increments—typically in the range of mK. That is, the radiation incident on the absorber element corresponds to the complementary power which is required for the state change of the nanowire from superconducting to high-resistance with the result that a measure for the intensity of the absorbed radiation is given.

The basic principle is known in electronics as simple delta-sigma ADC. In the present case, a thermal delta-sigma converter is achieved in which the working quantity is not voltage or current but the temperature. By this means a digitization is achieved in an intrinsic manner.

As a result of the thermal inertia of the system comprising the absorber element having a certain low thermal capacity and the nanowire connected in a thermally conducting manner, the thermal time constant of a detector element lies in the μs range which determines the possible time resolution of a measured value. As a result of the extremely rapid reaction time of the nanowire, a very efficient readout can take place, which is in particular a great advantage in the case of a plurality of detector elements which represent pixels of a detector and for example, are arranged in linear form or matrix form. It is then not necessary to construct its own readout circuit for each detector element or pixel, which would be constructively complex, expensive and space-intensive and would result in a poor production yield. Instead, the available space can be used for sensitive surfaces and as a result of the intrinsically high reaction time of the nanowire readout can take place serially in a time multiplex method. Practically attainable readout rates typically lie in the range from 100 MHz to 500 MHz, preferably in the range from about 300 MHz. That is, the number of detector elements connected in series can easily be of the order of magnitude of 1000 if time resolutions of several kHz are required or of the order of magnitude of 10 kHz as is usual in the medical range.

Accordingly in a preferred embodiment of the apparatus according to the invention, it is provided that a plurality of detector elements are provided.

The detector elements can in principle be arranged arbitrarily, wherein as already stated, a large number of detector elements can be read out in series. In order to facilitate the serial readout constructively or through the arrangement of the individual detector elements with respect to one another, in a particularly preferred embodiment of the apparatus according to the invention it is provided that the detector elements are arranged along at least one line, preferably along a plurality of lines, particularly preferably along a plurality of parallel lines. Here it is possible to read out the detector elements of one line in series in each case. The lines need not run straight but can fundamentally also be curved and, for example, be executed as circular arcs. Furthermore, a matrix-like arrangement or in general a grid-like arrangement of the detector elements can also be simply implemented from the lines.

Similarly to that stated above, in a method for detecting radiation, preferably x-ray radiation, wherein an absorber element and a nanowire made of a superconducting material in thermally conducting communication with the absorber element are cooled to a temperature in the range of the transition temperature of the nanowire, wherein the radiation is absorbed by means of the absorber element and wherein it is continuously determined whether the nanowire is in a superconducting state or not, it is provided according to the invention that energy pulses are continuously supplied to the absorber element by means of a heating means, as long as the nanowire is in the superconducting state and the power which is hereby supplied to the absorber element is determined.

The apparatus according to the invention and the method according to the invention is suitable for radiation of the most diverse type. Radiation is to be understood in the broadest sense as any type of radiation which results in an energy input in the absorber, which energy input in turn leads to a certain heating of the absorber. Examples for possible different types of radiation are: ionizing radiation, in particular x-ray radiation, alpha, beta or gamma radiation; generally electromagnetic radiation, in particular in the optically visible range or in the infrared range or UV range; sound; particles which are adsorbed at the absorber; particles which trigger a chemical reaction on or in the absorber.

It is understood in this case that the absorber must be adapted to the respective type of radiation, i.e. the absorber must be clearly designed so that an interaction cross-section greater than zero is present for the radiation to be detected.

In order to ensure a particularly good absorption of x-ray radiation, in a preferred embodiment of the apparatus according to the invention it is provided that the absorber element of the at least one detector element is made of bismuth. The surface of the absorber element can, for practical reasons, be made inert, e.g. by fluorinating, in particular to protect from chemical environmental influences.

The absorber element can be geometrically suitably dimensioned in order on the one hand to ensure a sufficiently high cross-section and on the other hand to allow a high spatial resolution. For example, the absorber element can be designed as platelets having lateral dimensions with side lengths between 1 μm and 200 μm, preferably between 10 μm and 100 μm. In the case of x-ray radiation to be detected, the cross-section can be adapted to the energy of the x-ray radiation by suitable selection of the thickness—the harder the radiation, the thicker the plates. At x-ray radiation energies such as are usual, for example in medical applications, the thickness of the absorber element can, for example, be between 50 μm and 200 μm, preferably between 75 μm and 150 μm. That is, in this case the thickness is typically of the same order of magnitude as the side length of the absorber element.

This therefore results in fundamentally extremely high attainable spatial resolutions which predestine the apparatus according to the invention or the method according to the invention in particular for applications in medicine such as, for example, in mammography.

Generally nanowire is understood as a wire whose dimensions can usually be very much greater than a few nanometers and typically lie in the range of about 100 nm.

A cooling bath containing a cooling liquid for example can be used as cooling means for producing the low temperature, the absorber element and the nanowire being connected in a thermally conducting manner to this cooling bath. In particular a carrier made of a material which has a particularly high thermal conductivity at low temperatures such as, for example, sapphire, to which the absorber element and the nanowire are connected in a thermally conducting manner, comes into consideration for such a thermally conducting connection. Depending on the transition temperature of the nanowire, different cooling liquids can be used, e.g. liquid medium or liquid nitrogen. That is, it is not usually necessary to cool to mK but absorber and nanowire are typically cooled to temperatures of a few K, preferably in the range of 4 K to 77 K, which allows the use of cost-effective cryostats. The transition temperature is fundamentally a material property of the nanowire, wherein the material can be a superconductor or possibly a high-temperature superconductor.

Accordingly, in a preferred embodiment of the apparatus according to the invention, it is provided that the nanowire of the at least one detector element is made of niobium nitride or tantalum nitride. The actual transition temperatures can depend on the specific geometrical measurements and are typically in the range between 4 K and 16.5 K. The transition temperature is additionally dependent on the current density in the nanowire and optionally also on a magnetic field which is present, wherein the latter is consequently always assumed to be zero.

It is noted that the temperature of the nanowire and the temperature of the absorber element do not necessarily need to be exactly the same. In particular, the absorber element can be slightly warmer than the nanowire, although the converse case is also feasible.

The absorber element has a very low thermal capacity in order to ensure that an energy input by absorbed radiation gives rise to a noticeable increase in temperature of the absorber element. On the one hand, the material of the absorber element can be suitably selected for this purpose, on the other hand the low temperature ensures a low thermal capacity.

In order to achieve a particularly good thermal connection between absorber element and nanowire, in a preferred embodiment of the apparatus according to the invention, it is provided that the absorber element of the at least one detector element is deposited on the nanowire of the at least one detector element.

The determination as to whether the nanowire is in the superconducting state or not can be performed as a resistance measurement. In particular, a voltage drop at an Ohmic resistance connected in series or parallel to the nanowire can be determined for this.

A radiation source for electromagnetic pulses in the optical range or infrared range can be used as heating means by means of which thermal pulses can be generated. That is, the absorber element is exposed to these electromagnetic pulses in order to bring about an incremental increase in the temperature of the absorber element. In this case, the radiation source can be arranged at a certain distance from the absorber element, which can be constructively advantageous.

In a preferred embodiment of the apparatus according to the invention, it is provided that an Ohmic resistance is provided as the at least one heating means which is connected in a thermally conducting manner to the absorber of the at least one detector element. This is a particularly simple variant from the manufacturing technology and constructive viewpoint. The Ohmic resistance is exposed to current pulses in order to produce energy pulses.

For a particularly stable measurement arrangement it is advantageous if during the measurement the nanowire is supplied or operated with current close to the critical current density. Preferably this is a precise constant current but in principle a pulse current would also be feasible. Accordingly, in the manner described above with the aid of the continuous energy pulses which are supplied to the absorber element, the power that is required to bring the absorber element to that temperature level at which the nanowire is operated on average specifically at the critical current density is determined. Thus, in a preferred embodiment of the apparatus according to the invention, it is provided that a power source is provided in order to operate the nanowire of the at least one detector element in the operating state of the apparatus in the range of 70% to 99%, preferably in the range of 80% to 95% of its critical current density.

In order to be able to use the apparatus in the most diverse surroundings, in particular in air or in an atmosphere as well as preferably at room temperature, in a preferred embodiment of the apparatus according to the invention, it is provided that at least one detector element is disposed in a thermally insulated container which has a window for the radiation to be detected. For x-ray radiation, for example windows made of beryllium or plastic come into consideration. Depending on the material of the container, the window can also be executed in one piece with the container. This naturally also depends on the type of radiation. In particular, it is feasible that a special window can be dispensed with if, for example neutrons or very high-energy gamma quanta are to be detected.

As a result of the high detection sensitivity and the advantageous dimensioning possibilities, the apparatus according to the invention and the method according to the invention are particularly suitable for measurements where radiation is to be detected which is attenuated and also scattered by an object to be investigated. This opens up new possibilities for example in computer tomography methods, in particular in the medical area, since so far only the attenuated radiation is detected and used for image reconstruction. Thus, an arrangement for determining radiation scattered in an object to be investigated and radiation attenuated in the object to be investigated is provided according to the invention, the arrangement comprising a radiation source for generating a fan beam with partial beams having different fan angles for illuminating the object to be investigated at different directions of incidence lying in a fan central plane, the arrangement further comprising a first apparatus according to the invention and a second apparatus according to the invention, wherein at least a part of the detector elements of the first apparatus is arranged downstream of the object to be investigated when viewed in the directions of incidence and wherein at least a part of the detector elements of the second apparatus is arranged laterally offset with respect to the detector elements of the first apparatus when viewed parallel to an axis connecting the radiation source and the object to be investigated.

The fan angles are measured in the fan central plane in which the directions of incidence also lie. That is each fan angle corresponds to a direction of incidence. However, the fan angle naturally also has a certain angular extension in a normal plane which is normal to the fan central plane. Accordingly, an opening angle 213 of the fan beam can be measured in the normal plane.

Preferably all the detector elements of the first apparatus are arranged downstream of the object to be investigated when viewed in the directions of incidence. Accordingly, substantially all the partial beams which pass attenuated by unscattered or "directly" through the object to be investigated can be detected by means of the first apparatus.

In conventional apparatuses which are used to detect attenuated radiation and in particular in computer tomography applications, collimator septa are arranged between the detector elements. These are dimensioned so that it is ensured that only partial beams passing directly through the object to be investigated and no scattered partial beams are detected. This in turn is usually associated with a considerable space requirement of the collimator septa and therefore a considerable loss of sensitive detector surface.

As will be explained in detail further below, in the present case collimator septa can be dispensed with between the detector elements of the first apparatus. The detector elements of the first apparatus therefore detect both attenuated partial beams which have passed directly through the object to be investigated and also partial beams scattered in the object to be investigated. Due to the lack of collimator septa between the detector elements of the first apparatus, the detector elements of the first apparatus can be arranged close to one another so that a very large sensitive detector surface can be achieved.

The detector elements of the second apparatus are therefore used in principle to detect exclusively one "species" of radiation—scattering radiation or unscattered radiation.

In the initially following exemplary embodiments exclusively scattered radiation is detected with the detector elements of the second apparatus. Thus, it would also be possible in principle that when viewed in the direction of incidence, some of the detector elements of the second apparatus are arranged upstream of the object to be investigated in order to detect back-scattered components. In order to ensure that no partial beams which have passed directly through the object to be investigated but only scattered partial beams are detected by the detector elements of the second apparatus, the, preferably all the detector elements of the second apparatus are accordingly laterally offset with respect to the detector elements of the first apparatus. "Laterally" here can mean in the top, bottom, left or right viewing direction.

This opens up the possibility, based on the measured pure scattered radiation, to subtract computationally a corresponding component from the measured sum of attenuated and scattered radiation for each detector element of the first apparatus and thus—without using collimator septa between the detector elements of the first apparatus—determine the exclusively attenuated partial beams. For this purpose, it can in particular be assumed that the scattering of a partial beam by the object to be investigated is at least approximately rotationally symmetrical about this partial beam. Accordingly the detector elements of the second apparatus are arranged offset with respect to the detector elements of the second apparatus so that in the case of a rotationally symmetrical spatial distribution of the scattered radiation of the respective partial beam, the same component of the respective partial beam would be scattered into the respective offset detector element of the second apparatus as into a detector element of the first apparatus adjacent to the respective detector element of the first apparatus in which adjacent detector element an attenuated partial beam adjacent to the respective partial beam would be measured. In principle any neighbours can be considered here. In particular, not only the nearest neighbours can be considered as adjacent detector elements but also next-but-one neighbours, next-but-two neighbours etc.—in general neighbours of any order—can be considered.

Accordingly, a method for determining radiation scattered in an object to be investigated and radiation attenuated in the object to be investigated is provided, wherein the object to be investigated is illuminated by a fan beam with partial beams having different fan angles, wherein by means of a method according to the invention, a sum of partial beams attenuated in the object to be investigated and radiation scattered in the object to be investigated is measured, wherein the measurement is made in at least one dimension by means of a plurality of detector elements in a spatially resolved manner such that the individual partial beams are spatially resolved.

Furthermore, in a particularly preferred embodiment of the method according to the invention for determining radiation scattered in an object to be investigated and attenuated radiation, it is provided that by means of a further method according to the invention, exclusively scattered radiation is measured, wherein the measurement is made in at least one dimension in a spatially resolved manner at least at those locations in which with an assumed rotationally symmetrical spatial distribution of the scattered radiation of each partial beam the same proportion of the respective partial beam would be scattered as in a location at which an attenuated partial beam adjacent to the respective partial beams is measured. That is, a spatially resolved measurement of individual partial beams takes place.

Likewise, in a preferred embodiment of the method according to the invention for determining radiation scattered in an object to be investigated and attenuated radiation, it is provided that for the locations at which the attenuated partial beams are measured, the exclusively attenuated radiation is computed by subtracting in each case from the measured sum of the attenuated radiation and scattered radiation corresponding parts of the measured exclusively scattered radiation. Here the specific geometry of the detector elements of the first apparatus and the second apparatus should be taken into account, in particular differences in the geometry of the detector elements. Arithmetic and weighting factors are obtained in the simplest case merely from the geometry of the detector elements used. Furthermore, arithmetic and weighting factors can optionally be derived and adapted from a spatial modelling of the beam paths.

In a preferred embodiment of the arrangement according to the invention, it is provided that the detector elements of the first apparatus are arranged along a line which preferably lies in the fan central plane, that the detector elements of the second apparatus are arranged along a plurality of lines and that when viewed from the radiation source, the lines of the detector elements of the second apparatus alternately with respect to one another and preferably with respect to the line of the detector elements of the first apparatus, have an offset angle which is measured in a normal plane which is normal to the fan central plane. This is a particularly simple embodiment from the constructive and manufacturing technology viewpoint wherein preferably all the lines of the second apparatus are arranged on the same side in relation to the lie of the first apparatus. All the lines can thus have the same offset angle with respect to one another but different spacing angles are also feasible.

In a preferred embodiment of the arrangement according to the invention, it is provided that the course of the plurality of lines of the detector elements of the second apparatus substantially follows the course of the line of the detector elements of the first apparatus. The line of the first apparatus can be curved and also need not lie in a single plane. The course of the lines of the second apparatus is then accordingly also curved and need not lie in a single plane. In the simplest case, all the lines are parallel straight lines which preferably lie in the same plane.

In order to provide more sensitive detector surface area and therefore increase the detection sensitivity, in a preferred embodiment of the arrangement according to the invention, it is provided that the detector elements of the first apparatus are additionally arranged along a further line, that the detector elements of the second apparatus are additionally arranged along further lines and that when viewed from the radiation source, the further lines of the detector elements of the second apparatus alternately with respect to one another and preferably with respect to the further line of the detector elements of the first apparatus have a further offset angle which is measured in the normal plane. All the further lines can have the same further offset angle with respect to one another but different further offset angles are also feasible.

In order to achieve a constructively simple arrangement, in a preferred embodiment of the arrangement according to the invention, it is provided that the detector elements of the first apparatus are arranged between the detector elements of the second apparatus. Preferably a substantially symmetrical arrangement about the fan central plane can be achieved as a result which has a high detection sensitivity.

In a preferred embodiment of the arrangement according to the invention, it is provided that the course of the further line of the detector elements of the first apparatus substantially follows the course of the line of the detector elements of the first apparatus and that the course of the further lines of the detector elements of the second apparatus substantially follows the course of the further line of the detector elements of the first apparatus. As already mentioned, the line of the first apparatus can be curved and also need not lie in an individual plane. The course of all the other lines is then accordingly also curved and need not lie in a single plane. In the simplest case, all the lines are parallel straight lines which preferably lie in the same plane.

In a preferred embodiment of the arrangement according to the invention, it is provided that when viewed from the radiation source the detector elements of the line and the further line of the first apparatus have an offset angle which is measured in the fan central plane. By this means, the resolution of the fan angle is increased, preferably doubled. The detector elements of the first apparatus need not be arranged in one plane or the line and the further line of the first apparatus need not be arranged in one plane.

Similarly, in a preferred embodiment of the arrangement according to the invention, it is provided that when viewed from the radiation source, the detector elements of the lines and the further lines of the second apparatus have the offset angle with respect to one another. The detector elements of the second apparatus need not be arranged in one plane or the lines and the further lines of the first apparatus need not be arranged in one plane.

As stated, collimator septa between detector element of the first apparatus can be dispensed with since the scattered radiation detected by these detector elements based on the measurements with the second apparatus can be eliminated by computation. In order to ensure in the described embodiments with linearly arranged detector elements that the respective detector element of the second apparatus only detects that scattered component of a partial beam which—assuming rotationally symmetrical scattering—is also scattered into a detector element of the first apparatus adjacent to the respective detector element of the first apparatus, wherein the direct attenuated component of the partial beam is detected by the respective detector element of the first apparatus, collimator septa are provided between the detector elements of the second apparatus. Thus, in a preferred embodiment of the arrangement according to the invention, it is provided that collimator septa are only provided between detector elements of the second apparatus, wherein the collimator septa are preferably arranged between detector elements of the second apparatus which are arranged successively along one of the lines and/or the further lines.

Another possibility for achieving a high detection sensitivity consists in the flat or two-dimensional arrangement of the detector elements of the first and second apparatus. As a result of a grid-like arrangement of the detector elements of the first apparatus, gaps can be created between these detector elements in which the detector elements of the second apparatus can be arranged. This results in a large sensitive overall surface both for the first apparatus and also for the second apparatus. In order to ensure that only one "species" of radiation is detected by the second apparatus, the detector elements of the second apparatus are offset not only laterally but also downstream of the detector elements of the first apparatus, i.e. the detector elements of the second apparatus have a greater distance from the radiation source or from the object to be investigated than the detector elements of the first apparatus. In this case, the detector elements of the second apparatus are arranged so far downstream of the detector elements of the first apparatus that the former can in practice only be reached by unscattered partial beams. Naturally also the size ratio between the dimension of the sensitive surface of the absorber elements of the detector elements of the second apparatus and the distance between these detector elements and those of the first apparatus can be adapted accordingly.

In a certain manner, the detector elements of the first apparatus which are reached both by scattered and also by unscattered partial beams therefore act as collimator septa for the detector elements of the second apparatus. In order to enable a constructively simple and cost-effective implementation, both the detector elements of the first apparatus and also the detector elements of the second apparatus are arranged in parallel planes. Accordingly in a preferred embodiment of the arrangement according to the invention, it is provided that the detector elements of the first apparatus are arranged in a first plane on a two-dimensional grid, that the detector elements of the second apparatus are arranged in a second plane parallel to the first plane which, when viewed from the radiation source, is arranged downstream of the first plane, and that when viewed in a normal direction normal to the two planes, the detector elements of the second apparatus are arranged in gaps between the detector elements of the first apparatus.

In order to be able to determine for the detector elements of the first apparatus how large is the proportion of unscattered radiation in the overall detected radiation, in a preferred embodiment of the arrangement according to the invention, it is provided that a third apparatus according to the invention is provided whose detector elements are arranged in a third plane which is arranged parallel to the first plane and second plane as well as between the first plane and second plane, wherein the detector elements of the third apparatus when viewed in the normal direction are covered by the detector elements of the first apparatus. Preferably for each detector element of the first apparatus there exists a corresponding detector element of the third apparatus which is arranged directly downstream of the respective detector element of the first apparatus and is covered or shield by this. This shielding of the detector elements of the third apparatus by the detector elements of the first apparatus has the effect that the detector elements of the third apparatus cannot be reached by unscattered partial beams but only by scattered partial beams. The proportion of direct or unscattered attenuated partial beams in the detector elements of the first apparatus is therefore obtained by subtracting the scattered partial beams measured by the corresponding detector elements of the third apparatus. Optionally calibration factors can be used here.

With exactly defined surface ratios between the detector elements or absorber elements of the first and second apparatus, the third apparatus can be dispensed with. The magnitude of the unscattered radiation $D1d_j$ in a detector element j of the first apparatus can then be calculated as follows:

$$D1d_j = \frac{kD1_j + D2_j}{k+1} - \frac{1}{N}\sum_{i=1}^{N}(kD1_i - D2_i),$$

where $D1_{j(i)}$ is the magnitude of the radiation measured in the detector element j or i of the first apparatus (which is a sum of scattered and unscattered radiation), $D2_{j(i)}$ is the magnitude of the radiation measured in the detector element j or i of the second apparatus (only direct or unscattered radiation), k is the surface ratio between the absorber elements of the first apparatus and the second apparatus minus 1, N is the number of detector elements considered which is obtained from the number of neighbours considered plus 1 (the detector element $D1_j$ is taken into account in the sum).

At a low radiation dose or a low intensity of the measured radiation, the detector elements of the first and second apparatus have a quantum noise component which is reduced by summation. It is a permissible assumption that the scattered radiation component has a lower spatial frequency than the unscattered component since it is composed of components of many propagation directions or many scattered partial beams and therefore must be averaged over a larger area. In particular, the quantization noise of the scattered light detection does not increase the noise of the measurement or computation result due to the spatial averaging. It is therefore sufficient to arrange detector elements only in two planes which is particularly friendly in terms of manufacturing technology.

Finally it should be noted that the detector elements can be fabricated very cost-effectively since in the simplest case they substantially only consist of a cheap chemical element and no very complex structures are required for the readout. The latter can be produced, for example by simple evaporation or microlithographic patterning.

The specific arrangement of the detector elements of a plurality of devices which makes it possible to dispense with collimator septa is fundamentally also possible with other detector elements which operate with scintillators for example. By using devices according to the invention however, particularly favourable relationships are obtained since the dimensions of the absorber elements in all three dimensions can be of the same order of magnitude of typically 10 μm to 100 μm.

It should further be noted that the arrangements described can also be used for determining radiation scattered in the object to be investigated and attenuated radiation using convention devices for detecting radiation, albeit not so efficiently. For this purpose in the case of that stated above with respect to the arrangements, the apparatus according to the invention can in principle be replaced by all apparatus which has detector elements suitable for detecting radiation and which allow arrangements of the detector elements along lines or grid-like structures.

BRIEF DESCRIPTION OF THE FIGURES

The invention is now explained in detail with reference to exemplary embodiments. The drawings are exemplary and are intended to set out the inventive idea but in no way restrict or even definitively reproduce it.

In the figures.

DETAILED DESCRIPTION OF EXEMPLARY EMBODIMENTS OF THE INVENTION

Figure 1:
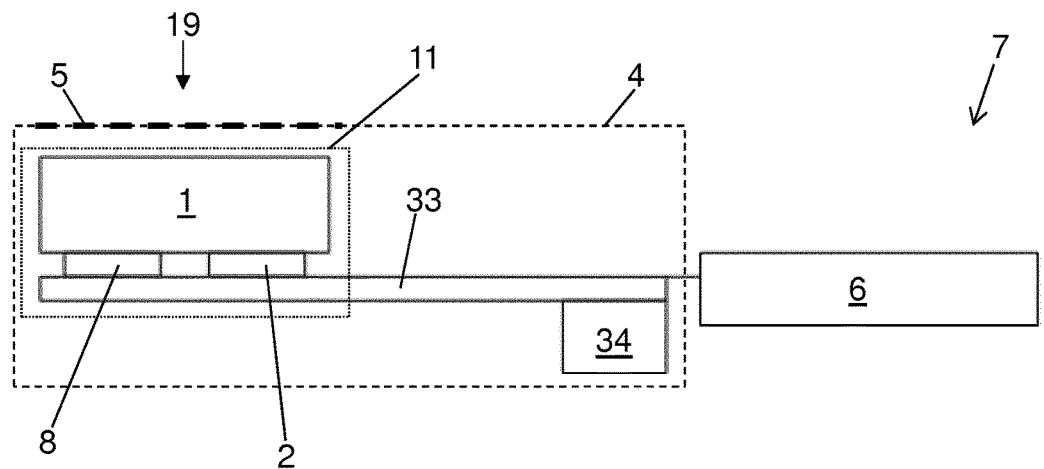
FIG. 1 shows a schematic structure of an apparatus according to the invention in side view

FIG. 1 shows the schematic structure of an apparatus 7 according to the invention for detecting radiation, wherein in the exemplary embodiments shown the detection of x-ray radiation is assumed. The apparatus 7 comprises a detector element 11 with an absorber element 1 which is typically made of bismuth and with a superconducting nanowire 2 which is typically made of niobium nitride and is connected to the absorber element 1 in a thermally conducting manner. Typically the absorber element 1 is designed in a plate shape, wherein a side length of the absorber element 1 for all three spatial dimensions lies in the range of 100 μm. Further, an Ohmic resistance 8 is provided which is also connected to the absorber element 1 in a thermally conducting manner.

The absorber element 1 and the nanowire 2 are connected via a carrier 33, typically made of sapphire, to a refrigerated bath 34 which cools the absorber element 1 and the nanowire 2 in an operating state of the apparatus to a temperature in the range of the transition temperature $T_C$ of the nanowire 2. At this temperature the carrier 3 exhibits excellent heat conduction. The refrigerated bath 34 operates for example with liquid helium or liquid nitrogen.

For thermal insulation towards the outside the detector element 11 and the refrigerated bath 34 are arranged in a thermally insulating container 4 or a cryostat. In order that x-ray radiation can impinge upon the absorber element 1 unhindered in a direction of incidence 19, the container 4 has a substantially transparent window 5 for the x-ray radiation which in the exemplary embodiment shown is made of beryllium.

Furthermore, the apparatus 7 has an evaluation and control unit 6 by means of which in the operating state of the apparatus 7 it is continuously determined whether the nanowire 2 is superconducting or not.

Furthermore, the Ohmic resistance 8 can be exposed to current pulses by means of the evaluation and control unit 6. Since the energy supplied in pulsed mode is converted into heat in the Ohmic resistance, the current pulses form a pulsed heating current $i_H$. As a result of the thermally conducting connection between the Ohmic resistance 8 and the absorber element 1, energy can therefore be supplied in pulsed mode to the absorber element 1 and its temperature increased in corresponding increments—even when no radiation to be detected is present. The evaluation and control unit 6 is designed so that in the operating state of the apparatus 7, energy pulses are continuously supplied to the absorber element as long as the nanowire 2 is located in the superconducting state. As soon as the nanowire 2 is high-resistance, no more energy pulses are supplied whereupon the absorber element 1 is cooled again as a result of the refrigerated bath 34.

The power required to bring the absorber element 1 to that temperature level at which the nanowire is located on average at the transition temperature $T_C$, can be calculated directly from the sequence of pulses.

If x-ray radiation is additionally incident on the absorber element, correspondingly fewer energy pulses must be supplied to the absorber element 1 by means of the Ohmic resistance since the absorbed x-ray radiation also results in an increase in the temperature of the absorber element 1 in small increments—typically in the mK range. That is, the radiation incident on the absorber element 1 corresponds to the complementary power which is required for the change in state of the nanowire 2 from superconducting to high-resistance, whereby a measure for the intention of the absorbed x-ray radiation is given.

The basic principle is known in electronics as simple delta-sigma ADC. In the present case, a thermal delta-sigma converter is achieved in which the working quantity is not voltage or current but the temperature T. By this means a digitization is achieved in an intrinsic manner.

Figure 3:
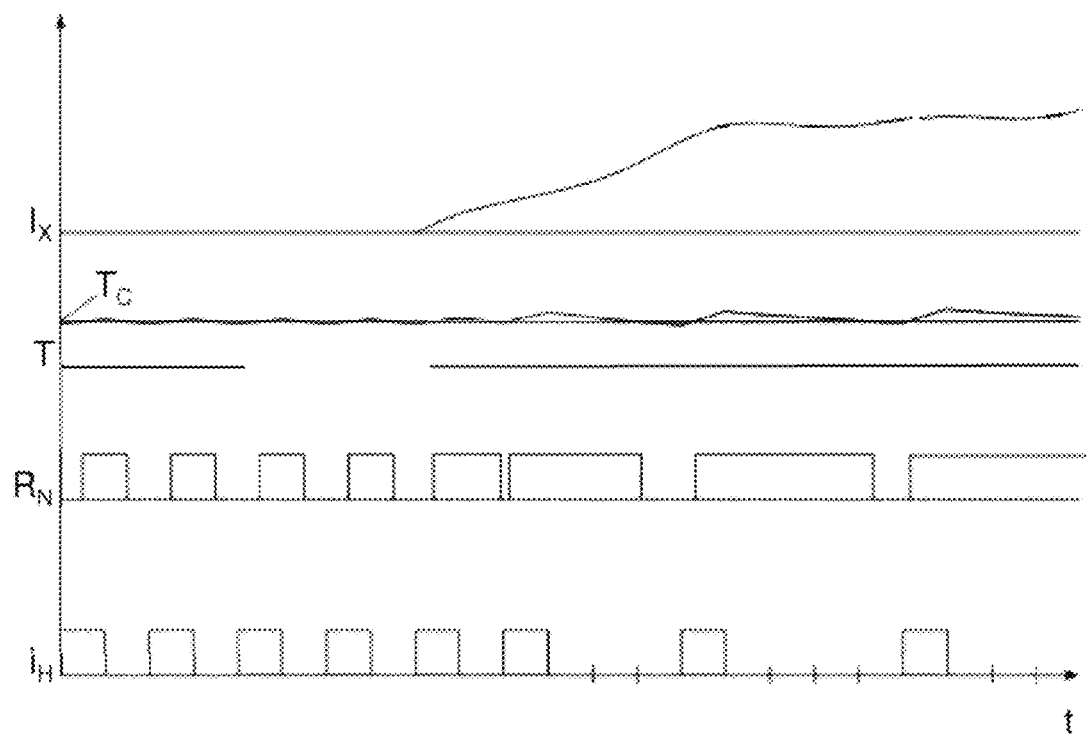
FIG. 3 shows a diagrammatic view of the operating mode of the apparatus according to the invention

The operating mode described is illustrated in FIG. 3, where the time behaviour of an intensity $I_X$ of the x-ray radiation incident on the absorber element 1, a temperature T of the nanowire 2, an electrical resistance $R_N$ of the nanowire 2 as well as the heating current $i_H$ is shown diagrammatically. In particular, here the intrinsic digitization due to the variation of $R_N$ as well as due to in is clearly apparent, wherein with increasing intensity $I_X$, the nanowire 2 becomes high-resistance increasingly more frequently or for longer and the pulses of the heating current in accordingly become less frequent.

Figure 2:
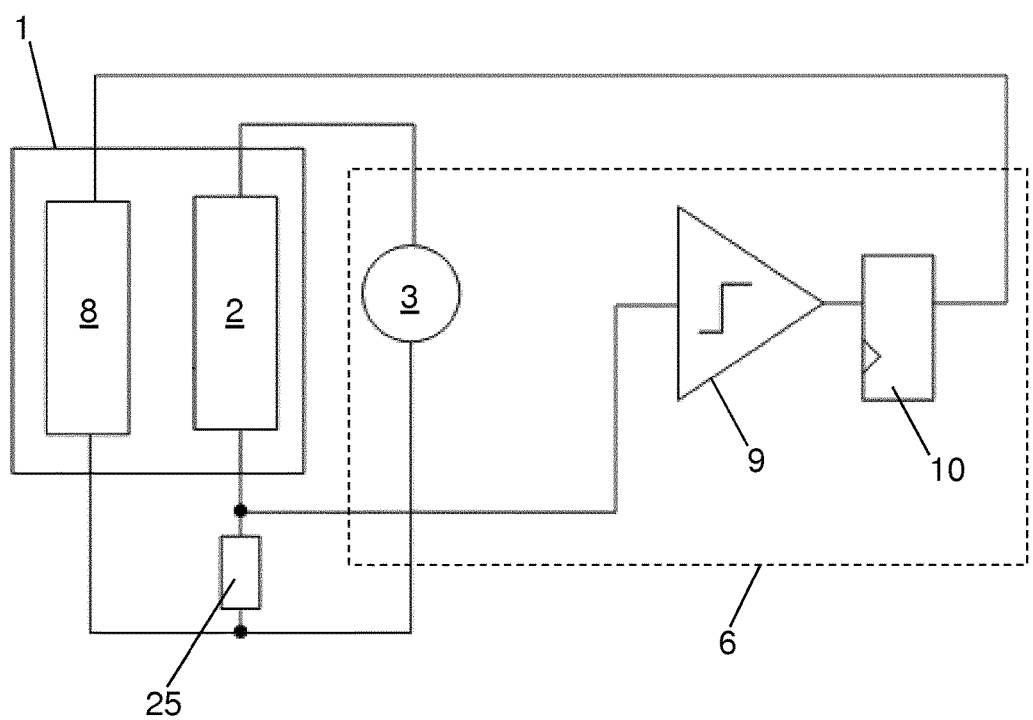
FIG. 2 shows a circuit diagram of the elements essential for the function of the apparatus according to the invention

FIG. 2 shows a circuit diagram of the elements essential for the function of the device 7. By means of a voltage source 3 a voltage is applied to the nanowire 2 and an Ohmic pre-resistance 25 connected in series with this in order to operate the nanowire 2 close to its critical current density, preferably in the range of 80% to 95% of the critical current density. Accordingly in the manner described with the aid of the continuous energy pulses which are supplied to the absorber element 1, that power is determined which is required to bring the absorber element to the temperature level at which the nanowire 2 is operated on average specifically at the critical current density.

By means of a comparator 9, it is determined whether the nanowire 2 is superconducting or high-resistance. Accordingly, the Ohmic resistance 8 is exposed to a current pulse or not by means of a flipflop 10 adjoining the comparator 9. In the exemplary embodiment shown the comparator 9, the flipflop 10 and the voltage source 3 are comprised by the evaluation and control unit 6.

As a result of the thermal inertia of the system comprising the absorber element 1 having a certain low thermal capacity and the thermally conducting nanowire 2, the thermal time constant of a detector element 11 lies in the ms range which determines the possible time resolution of a measured value. As a result of the very rapid reaction times of the nanowire 2 in the sub-nanosecond range, for many applications a plurality of detector elements 11 can be operated in series and read out in a time multiplex process. Attainable readout rates lie, for example, in the range of about 300 MHz. That is, the number of detector elements 11 connected in series can easily be of the order of magnitude of 1000 if time resolutions of several kHz or of the order of magnitude of 10 kHz, as is usual in the medical field, are required. The detector elements 11 operated in series can in particular be arranged linearly.

Figure 4:
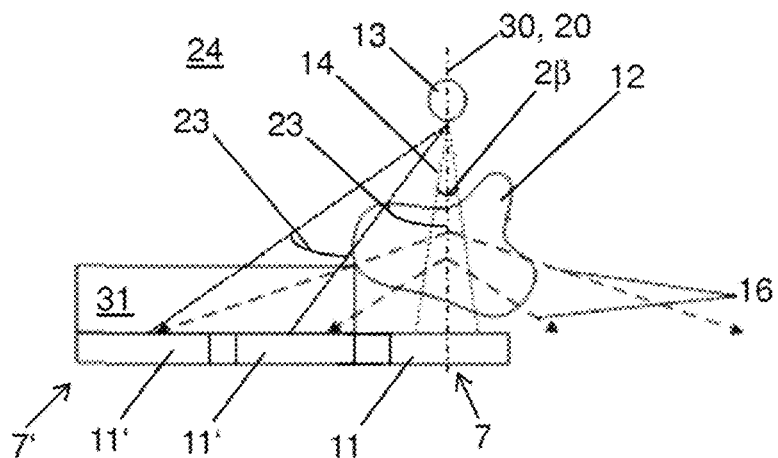
FIG. 4 shows an arrangement according to the invention for determining radiation scattered in an object to be investigated and attenuated radiation in a schematic first side view
Figure 5:
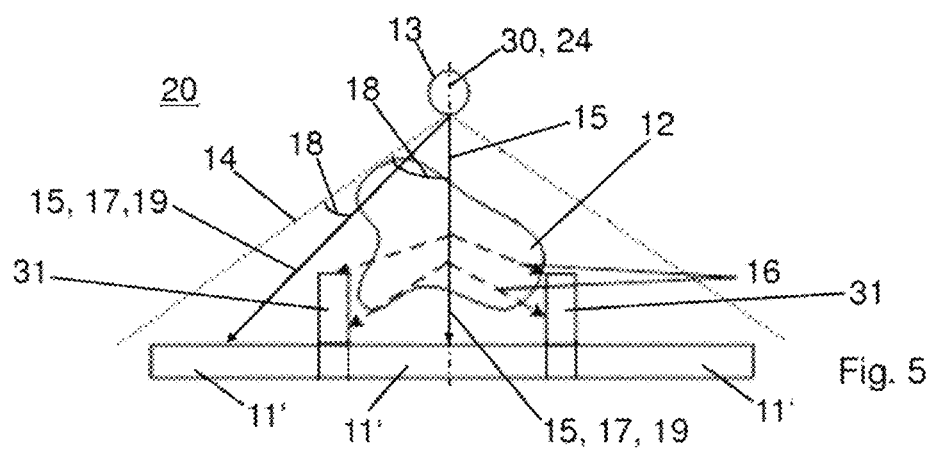
FIG. 5 shows the arrangement of FIG. 4 in a schematic second side view
Figure 6:
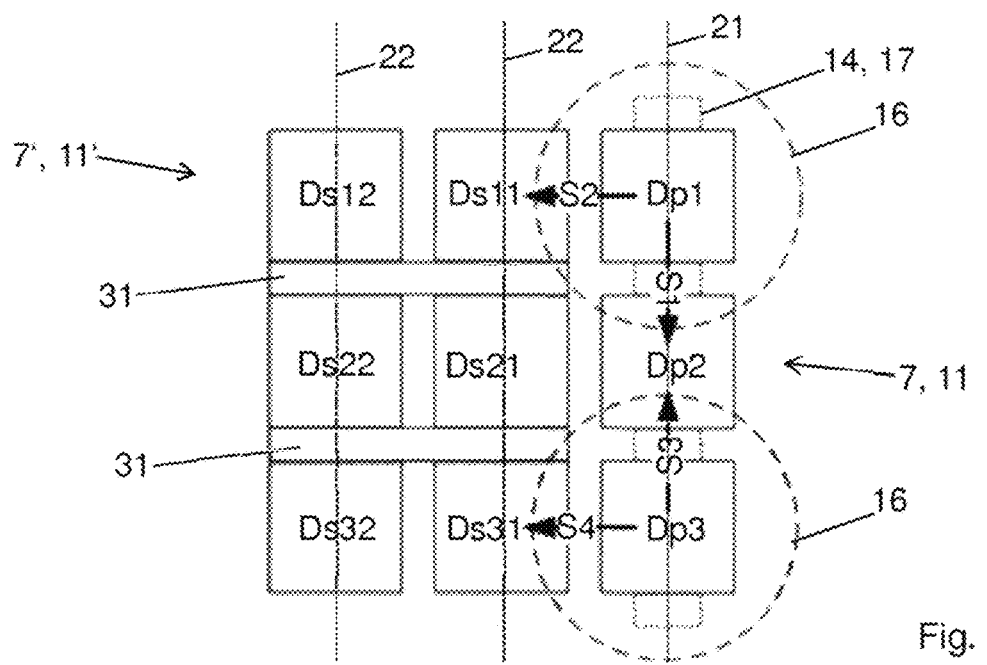
FIG. 6 shows a schematic detailed view of the devices according to the invention of the arrangement of FIG. 4 and FIG. 5

An example of application with detector elements 11 arranged in such a manner is shown in FIGS. 4, 5 and 6, wherein the apparatus 7 together with another apparatus 7' according to the invention is a part of an arrangement for determining x-ray radiation 16 scattered in an object to be investigated 12 and unscattered attenuated x-ray radiation 17. The apparatus 7 is hereinafter therefore also designated as first apparatus 7 and the further apparatus 7' is also designated as second apparatus 7'. Such arrangements can, for example, be used for computer tomography methods. In the exemplary embodiment shown the arrangement comprises an x-ray radiation source 13 which generates an x-ray fan beam 14.

As can be seen in FIG. 5, the x-ray fan beam 14 consists of x-ray partial beams 15 which have different fan angles 18 in the x-ray fan beam 14. The fan angles 18 are measured in a fan central plane 20 here which lies in the plane of the drawing in the diagram in FIG. 5.

In a normal plane 24 which is perpendicular to the fan central plane 20, the x-ray fan beam 14 or the x-ray partial beams 15 have an aperture angle of $2\beta$. Or, the x-ray partial beams 15 extend on both sides of the fan central plane 20 each with a half aperture angle $\beta$. This is illustrated in FIG. 4, wherein the normal plane 24 lies in the plane of the drawing in the diagram in FIG. 4.

The x-ray fan beam 14 is used to illuminate the object to be investigated 12 along an axis 30, wherein for example a computer tomography method can be herewith implemented to produce at least one sectional image of the object to be investigated 12. According to the different fan angles 18, the x-ray partial beams 15 have different directions of incidence 19 here. The sectional image should reproduce the structure of the object to be investigated 12 in the plane of intersection of the x-ray fan beam 14 with the object to be investigated 12, wherein the plane of intersection substantially corresponds to the fan central plane 20.

In conventional computer tomography methods, only the attenuation which is experienced by the x-ray partial beams 15 going through the object to be investigated 12 is determined. That is, specifically only the unscattered or attenuated x-ray radiation 17 is detected. In this case, (in many different rotational positions of the object to be investigated 12), absorption profiles are recorded from which the sectional image is calculated by means of mathematical methods known per se which are based on the filtered back projection.

The apparatus 7 according to the invention or the method according to the invention are naturally also suitable for detecting exclusively attenuated x-ray radiation 17. However, since the scattered x-ray radiation 16 is detected by means of the arrangement according to the invention, the detection sensitivity can be further increased with the result that a higher resolution is attainable and/or the dose burden for the object to be investigated 12 can be reduced.

As illustrated in FIG. 6, the detector elements 11 of the apparatus 7 are arranged along a line 21 so that the individual detector elements 11 detect x-ray partial beams 15 with different fan angles 18. No diaphragms or collimator septa are arranged between the individual detector elements 11. Accordingly, the detector elements 11 not only detect the unscattered x-ray partial beams 15 or not only the attenuated x-ray radiation 17 but also scattered x-ray radiation 16 which is the result of scattering of components of individual x-ray partial beams 15 in the object to be investigated 12. In this respect, the detector elements 11 can also be interpreted as "primary" detector elements which is why the three detector elements 11 shown in FIG. 6 are numbered with Dpj, j from 1 to 3, along the line 21.

As a result of the lack of collimator septa, the area of the primary detector elements 11 can be enlarged compared with known solutions which contributes definitively to the possibility of reducing the dose burden. By determining the scattered radiation 16, an image quality can be achieved which is at least the same as in conventional solutions.

The detector elements 11' of the second apparatus 7' are arranged along lines 22. In the exemplary embodiment shown the lines 21, 22 all run straight and parallel to one another and lie in the same plane, wherein the object to be investigated 12 is arranged between this plane and the x-ray source 13. The lines 22 when viewed along the axis 30 or when viewed in the directions of incidence 19 are accordingly laterally offset with respect to the line 21, i.e. the detector elements 11' are laterally offset with respect to the detector elements 11. In the diagram in FIG. 6 the lines 22 run to the left of the line 21. Accordingly, in the normal plane 24 offset angles 23 are obtained between the line 21 and the nearest line 22 as well as between the two lines 22, wherein the offset angles 23 have different values, cf. FIG. 4.

The sensitive area of the detector elements 11, 11' is formed by the respective absorber elements 1 which have a substantially square surface in the exemplary embodiment shown.

In the exemplary embodiment of FIGS. 4-6 the detector elements 11' are used to detect scattered x-ray radiation 16 but not unscattered attenuated x-ray radiation 17. In this respect, the detector elements 11' can also be interpreted as "secondary" detector elements which is why the six detector elements 11' shown in FIG. 6 are numbered with Dsmn where m goes from 1 to 2 and relates to the respective line and wherein n goes from 1 to 3 and numbers the detector elements 11' along one of the lines 22.

FIG. 6 shows the scattered x-ray radiation 16 which results from that x-ray partial beam 15 which is incident on the detector element Dp1, illustrated by a dashed circle around the detector element Dp1. Here the assumption is made that the scattered x-ray radiation 16 is rotationally symmetrical about the x-ray partial beam 15 causing this. Accordingly a component S1 of the said scattered x-ray radiation 16 is the same magnitude as a component S2 which is scattered in the detector element Ds11.

Similarly, the scattered x-ray radiation 16 which results from that x-ray partial beam 15 which is incident on the detector element Dp3 is illustrated by a dashed circle around the detector element Dp3. As a result of the assumed rotational symmetry, a component S3 of the said scattered x-ray radiation 16 which is scattered into the detector element Dp2 is the same magnitude as a component S4 which is scattered into the detector element Ds11.

The detector elements Dp1 and Dp3 are the nearest neighbours of the detector elements Dp2. It is understood that the above considerations can also be conducted in exactly the same way for the next-but-one neighbours or for neighbours of higher orders. By detecting the corresponding scattering components with the detector elements 11', the radiation measured in the detector elements 11 can be corrected arithmetically so that finally approximately only the unscattered attenuated x-ray radiation 17 which is incident on the detector elements 11 can be determined.

The specific arithmetic and weighting factors are fundamentally obtained from the geometry of the detector elements 11.11' used. Furthermore arithmetic and weighting factors can optionally be derived and adapted from a spatial modelling of beam paths.

If in the exemplary embodiment shown with detector elements 11, 11' having geometrically the same design, only the nearest neighbours are considered, this is an approximation. In the depicted exemplary embodiment of FIG. 6, an intensity $I_d$ (Dp2) of the unscattered attenuated x-ray radiation 17 in the detector element Dp2 would therefore be obtained as $$I_d(Dp2) = I(Dp2) - S2 - S4$$

wherein I(Dp2) is the total measured intensity in the detector element Dp2, i.e. the sum of the scattered x-ray radiation 16 and the unscattered attenuated x-ray radiation 17. In order to ensure that each detector element Dsmn only measures the "correct" scattered component and no superposition of scattered x-ray radiation 16 of several x-ray partial beams 15, collimator septa 31 are provided between those detector elements 11' of the second apparatus 7' which can be assigned to different x-ray partial beams 15 or different fan angles 18.

Figure 7:
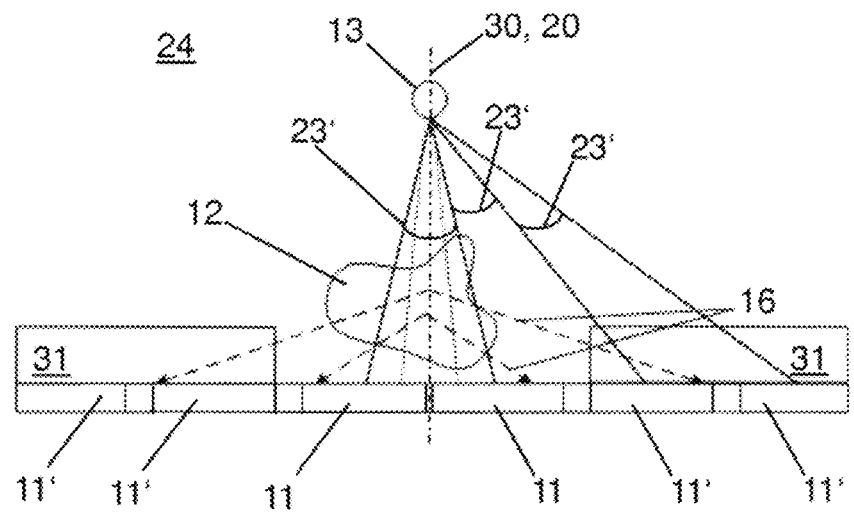
FIG. 7 shows another embodiment of the arrangement according to the invention in a view similar to FIG. 4
Figure 8:
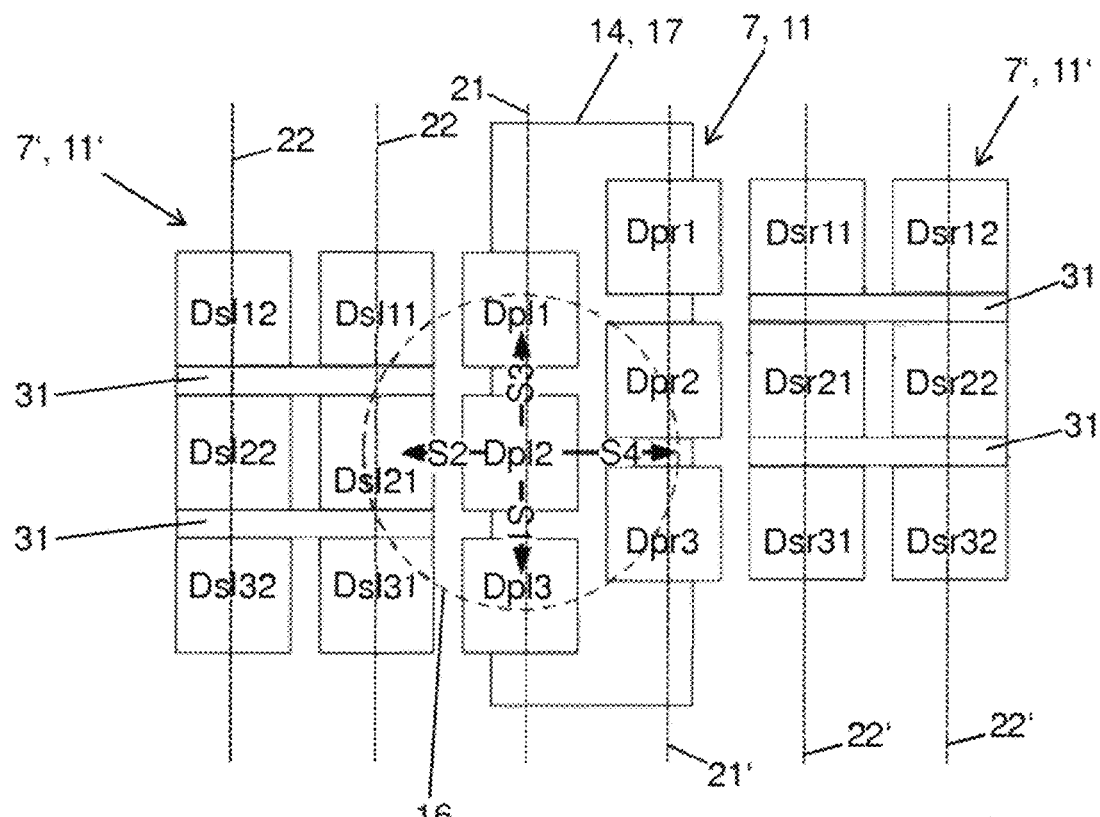
FIG. 8 shows a schematic detailed view of the devices according to the invention of the arrangement of FIG. 7

FIGS. 7 and 8 relates to another exemplary embodiment of an arrangement to determine x-ray radiation 16 scattered in the object to be investigated 12 and unscattered attenuated x-ray radiation 17 which is constructed fundamentally completely the same as the arrangement of FIGS. 4-6. In addition however, the first apparatus 7 has detector elements 11 along a further line 21'. Similarly the second apparatus 7' has further lines 22'.

As illustrated in FIG. 8, all the lines 21, 21', 22, 22' run straight or parallel to one another and lie in the same plane. The further line 21' is arranged to the right of the line 21 in the diagram in FIG. 8 and the further lines 22' on the right of the further lines 21'. Accordingly, further offset angles 23' are obtained between the further line 21' and the nearest further line 22' as well as between the further lines 22', wherein the further offset angles 23' have various magnitudes, cf. FIG. 7.

The nomenclature for the detector elements 11, 11' in FIG. 8 is fundamentally the same as in FIG. 6 but for all detector elements 11, 11' which are located on the left side, is additionally provided with an "l" for identification and for all detector elements 11, 11' which are located on the right side, is additionally provided with an "r".

In addition, the detector elements 11, 11' of the lines 21', 22' have an offset angle with respect to the detector elements 11, 11' of the lines 21, 22 in the fan central plane 20. Accordingly in the diagram in FIG. 8, the detector elements 11, 11' of the lines 21', 22' are arranged offset upwards with respect to the detector elements 11, 11' of the lines 21, 22. By this means a better spatial resolution is achieved or this is doubled.

The equations for subtraction of the scattered radiation components must now take into account both lines 21, 21' which for the same geometrical design of the detector elements 11, 11', for example, can be accomplished as follows (the designation of the intensities follows the nomenclature used above in the discussion of FIG. 6):

$$I_d(Dpl1)=(Dpl1)-2*[I(Dsl21)-[I(Dsr22)+I(Dsr32)]/2]-[I(Dsl32)-[I(Dsr33)+I(Dsr43)]/2]-[I(Dsr31)+I(Dsr41)]/2 -[I(Dsl43)+[I(Dsr44)+I(Dsr54)]/2]-[I(Dsr42)+I(Dsr52)]/2-((Dsl54)-I(Dsr53)/2-[sqrt(1,25)-1]*[[I(Dsr11)+I(Dsr21)]/2-I(Dsl12)]-[2-sqrt(1,25)]*[[I(Dsr12)+I(Dsr22)]*12-I(Dsl13)]-[sqrt(3,25)-1]*[I(Dsr31)-[I(Dsl22)+I(Dsl32)]/2]-[2-sqrt(3,25)*[I(Dsr32)-[I(Dsl23)+I(Dsl33)]/2]]-[sqrt(7,25)-2]*[I(Dsr42)-[I(Dsl33)+I(Dsl43)]/2]-[3-sqrt(7,25)]*[I(Dsr43)-[I(Dsl34)+I(Dsl44)]/2]-[sqrt(7,25)-2]*[I((Dsr42)-[I(Dsl33)+I(Dsl43)]/2]-[3-sqrt(7,25)]*[I(Dsr43)-[I(Dsl34)+I(Dsl44)]/2].$$

Figure 9:
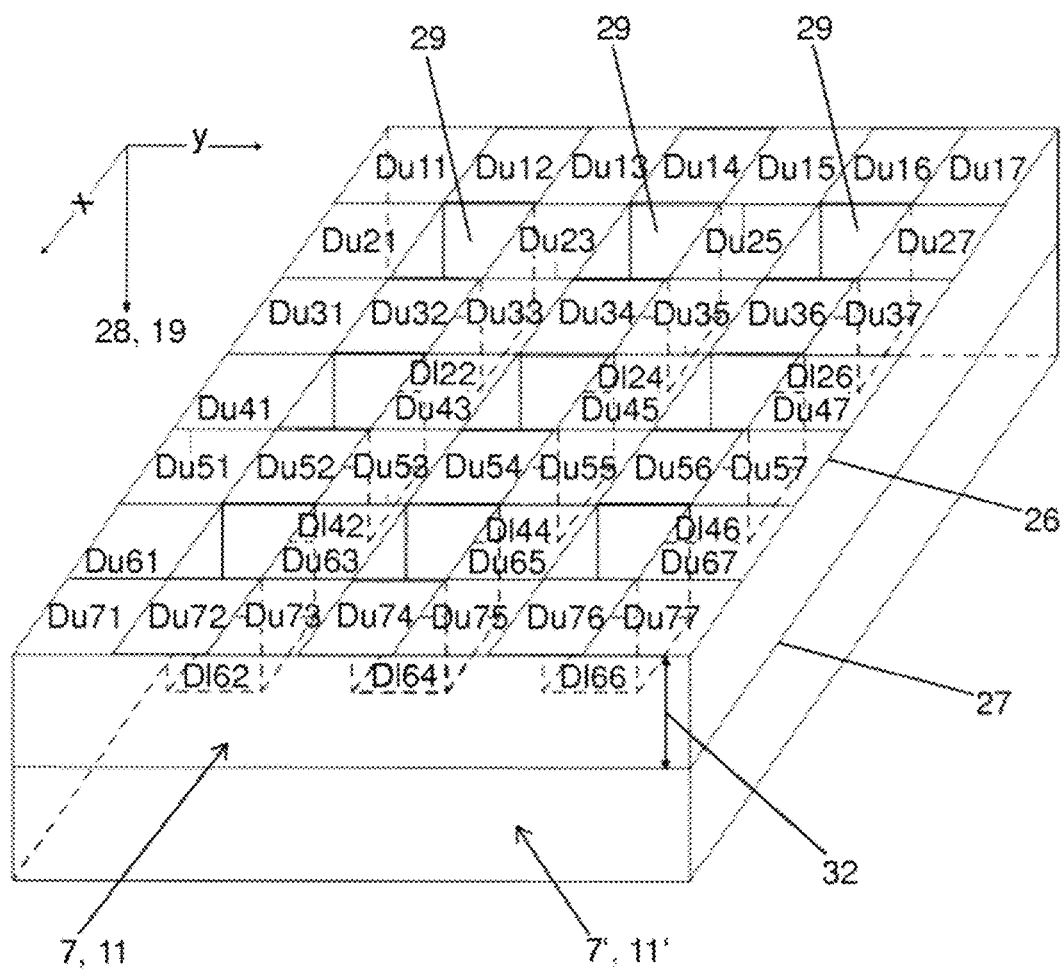
FIG. 9 shows a schematic detailed view of the devices according to the invention of another embodiment of the arrangement according to the invention, wherein detector elements of the apparatus are arranged two-dimensionally in planes.

Finally FIG. 9 shows a schematic detailed view of apparatus 7, 7' according to the invention of a further embodiment of the apparatus according to the invention. The detector elements 11 of the first apparatus 7 are arranged in two dimensions along an x direction and a y direction of a first plane 26. The detector elements 11' of the second apparatus 7' are also arranged two-dimensionally along the x direction and the y direction in a second plane 27.

The planes 26, 27 have a distance 32 from one another when viewed in a normal direction 28 normal to the planes 26, 27. In this case, some of the x-ray partial beams 15 are also incident on the detector elements n, n' in the normal direction 28, i.e. the direction of incidence 19 can be parallel to the normal direction 28. The detector elements 11 lie in the upper plane 26 ("up") which is arranged closer to the object to be investigated 12. The detector elements 11' lie in the lower plane 27 ("low") which is arranged further away from the object to be investigated or downstream of the plane 26 when viewed from the x-ray source 13. Accordingly the detector elements 11 in FIG. 9 are numbered with Duxy and the detector elements 11' with Dlxy.

The detector elements 11 are arranged in the first plane 26 in a grid shape in such a manner than gaps 29 are obtained. When viewed in the normal direction 28, the detector elements 11' are arranged in these gaps 29. The detector elements 11 therefore act as diaphragms for the detector elements 11'. The spacing is selected in relation to the size of the individual detector elements 11 so that the detector elements 11' can only be reached by unscattered attenuated x-ray partial beams 15. On the other hand, both the scattered x-ray radiation 16 and the unscattered attenuated x-ray radiation 17 is incident in the detector elements 11.

In this case that intensity Id(Duxy) which only corresponds to the intensity of the unscattered attenuated x-ray radiation 17 in the detector element Duxy can be determined at least approximately by computation. For example, for this purpose the detector elements 11, 11' immediately adjacent to the detector element Duxy being considered can be considered. In the arrangement shown in FIG. 9, two cases are then obtained: a) the detector element Duxy has two adjacent Dl neighbours and six adjacent Du neighbours. b) The detector element Duxy has four adjacent Dl neighbours and four adjacent Du neighbours. The areas of the detector elements 11, 11' are assumed to be the same. For a) this then gives $$Id(Duxy)=I(Duxy)-\tfrac{1}{7}*(I(Duxy)+I(Dux(y+1))+I(Dux(y-1))+I(Du(x-1)(y-1))+I(Du(x-1)(y+1))+I(Du(x+1)(y-1))+I(Du(x+1)(y+1))-7*(I(Dl(x-1)y)+I(Dl(x+1)y))/2$$

or $$Id(Duxy)=I(Duxy)-\tfrac{1}{7}*(I(Duxy)+I(Dux(x+1)y)+I(Du(x+1)(y+1))+I(Du(x-1)y)+I(Du(x-1)(y+1))+I(Du(x-1)(y-1))+I(Du(x+1)(y-1)-7*(I(Dlx(y+1))+I(Dlx(y-1)y)))/2$$

and for b)

$$Id(Duxy)=I(Duxy)-\tfrac{1}{5}*(I(Duxy)+I(Du(x+1)y)+I(Dux(x+1)(y+1)+I(Du(x-1)y)+I(Du(x-1)(y+1))+I(Du(x-1)(y-1))+I(Du(x+1)(y-1))-5*(I(Dlx(y+1))+I(Dlx(y-1))+I(Dl(x+1)y)+I(Dl(x-1)y))/4)$$

Here I(Duxy) designates the total intensity measured in the detector element Duxy (i.e. the total intensity of scattered x-ray radiation 16 and unscattered x-ray radiation 17) and I(Dlxy) is the measured intensity in the detector element Dlxy (only unscattered x-ray radiation 17.

That is, it is sufficient to arrange the detector elements 11, 11' only in two planes which is particularly friendly from the manufacturing technology viewpoint.

It should be noted that purely mathematically there are naturally significantly more possibilities for determining an estimated value from a set of perturbed measured values, possibly also mean minus median of the differences etc. The arithmetic cited above is to be understood merely as an example in order to make the approach according to the invention comprehensible: the attenuation useful signal has a higher spatial frequency than the scattered radiation component, therefore the scattered radiation component need not actually be measured for each point.

REFERENCE LIST

1 Absorber element
2 Nanowire
3 Voltage source
4 Thermally insulated container
5 Be window
6 Evaluation and control unit
7,7' Apparatus
8 Ohmic resistance
9 Comparator
10 Flipflop
11,11' Detector element
12 Object to be investigated
13 X-ray source
14 X-ray fan beam
15 X-ray partial beam
16 Scattered radiation
17 Unscattered or attenuated radiation
18 Fan angle
19,19' Direction of incidence
20 Fan central plane
21, 21' Line of detector elements of the first apparatus
22, 22' Line of detector elements of the second apparatus
23, 23' Offset angle
24 Normal plane
25 Pre-resistance
26 First plane
27 Second plane
28 Normal direction
29 Gap
30 Axis 31 Collimator septum
32 Distance between first and second plane
33 Carrier
34 Refrigerated bath
T Temperature of nanowire
$T_C$ Transition temperature
$R_N$ Electrical resistance of nanowire
t Time
$i_H$ Heating current
$I_X$ Intensity of the x-ray radiation incident on the absorber element
$2\beta$ Aperture angle

The invention claimed is:

1. An apparatus for detecting radiation, the apparatus comprising at least one detector element which comprises an absorber element for the radiation and a nanowire made of a superconducting material in thermally conducting communication with the absorber element, wherein cooling means are provided in order to cool the absorber element and the nanowire of the at least one detector element to a temperature in the range of the transition temperature of the nanowire in an operating state of the apparatus and wherein an evaluation and control unit is provided to determine whether the nanowire of the at least one detector element is in a superconducting state or not, characterized in that at least one heating means which can be controlled by means of the evaluation and control unit is provided in order to be able to supply a thermal energy pulse to the absorber element of the at least one detector element, wherein the evaluation and control unit is designed to continuously supply energy pulses to the absorber element of the at least one detector element in the operating state of the apparatus as long as the nanowire of the at least one detector element is in the superconducting state.

2. The apparatus according to claim 1, characterized in that an Ohmic resistance is provided as the at least one heating means which is connected in a thermally conducting manner to the absorber of the at least one detector element.

3. The apparatus according to claim 1, characterized in that a power source is provided in order to operate the nanowire of the at least one detector element in the operating state of the apparatus in the range of 70% to 99% of its critical current density.

4. The apparatus of claim 3 wherein the range comprises 80% to 95%.

5. The apparatus according to claim 1, characterized in that the at least one detector element is disposed in a thermally insulated container which has a window for the radiation to be detected.

6. The apparatus according to claim 1, characterized in that the nanowire of the at least one detector element is made of niobium nitride or tantalum nitride.

7. The apparatus according to claim 1, characterized in that the absorber element of the at least one detector element is made of bismuth.

8. The apparatus according to claim 1, characterized in that the absorber element of the at least one detector element is deposited on the nanowire of the at least one detector element.

9. The apparatus according to claim 1, characterized in that a plurality of detector elements are provided.

10. The apparatus according to claim 9, characterized in that the detector elements are arranged along at least one line.

11. The apparatus of claim 10 wherein the at least one line comprises a plurality of lines.

12. The apparatus of claim 11 wherein the plurality of lines comprises a plurality of parallel lines.

13. Arrangement for determining radiation scattered in an object to be investigated and radiation attenuated in the object to be investigated, the arrangement comprising a radiation source for generating a fan beam with partial beams having different fan angles for illuminating the object to be investigated at different directions of incidence lying in a fan central plane, the arrangement further comprising a first apparatus according to claim 8 and a second apparatus according to claim 8, wherein at least a part of the detector elements of the first apparatus is arranged downstream of the object to be investigated when viewed in the directions of incidence and wherein at least a part of the detector elements of the second apparatus is arranged laterally offset with respect to the detector elements of the first apparatus when viewed parallel to an axis connecting the radiation source and the object to be investigated.

14. The arrangement according to claim 13, characterized in that the detector elements of the first apparatus are arranged along a line which preferably lies in the fan central plane, that the detector elements of the second apparatus are arranged along a plurality of lines and that when viewed from the radiation source, the lines of the detector elements of the second apparatus alternately with respect to one another and preferably with respect to the line of the detector elements of the first apparatus have an offset angle which is measured in a normal plane which is normal to the fan central plane.

15. The arrangement according to claim 14, characterized in that the course of the plurality of lines of the detector elements of the second apparatus substantially follows the course of the line of the detector elements of the first apparatus.

16. The arrangement according to claim 14, characterized in that the detector elements of the first apparatus are additionally arranged along a further line, that the detector elements of the second apparatus are additionally arranged along further lines and that when viewed from the radiation source, the further lines of the detector elements of the second apparatus alternately with respect to one another and preferably with respect to the further line of the detector elements of the first apparatus have a further offset angle which is measured in the normal plane.

17. The arrangement according to claim 16, characterized in that the detector elements of the first apparatus are arranged between the detector elements of the second apparatus.

18. The arrangement according to claim 16, characterized in that the course of the further line of the detector elements of the first apparatus substantially follows the course of the line of the detector elements of the first apparatus and that the course of the further lines of the detector elements of the second apparatus substantially follows the course of the further line of the detector elements of the first apparatus.

19. The arrangement according to claim 16, characterized in that when viewed from the radiation source the detector elements of the line and the further line of the first apparatus have an offset angle with respect to one another which is measured in the fan central plane.

20. The arrangement according to claim 19, characterized in that when viewed from the radiation source, the detector elements of the lines and the further lines of the second apparatus have the offset angle with respect to one another.

21. The arrangement according to claim 14, characterized in that collimator septa are only provided between detector elements of the second apparatus.

22. The arrangement of claim 21 wherein the collimator septa are arranged between detector elements of the second apparatus which are arranged successively along one of the lines and/or further lines.

23. The arrangement according to claim 13, characterized in that the detector elements of the first apparatus are arranged in a first plane on a two-dimensional grid, that the detector elements of the second apparatus are arranged in a second plane parallel to the first plane which, when viewed from the radiation source, is arranged downstream of the first plane, and that when viewed in a normal direction normal to the two planes, the detector elements of the second apparatus are arranged in gaps between the detector elements of the first apparatus.

24. The arrangement according to claim 23, characterized in that a third apparatus according to claim 8 is provided whose detector elements are arranged in a third plane which is arranged parallel to the first plane and second plane as well as between the first plane and second plane, wherein the detector elements of the third apparatus when viewed in the normal direction are covered by the detector elements of the first apparatus.

25. A method for detecting radiation by means of a detector element which comprises an absorber element and a nanowire made of a superconducting material in thermally conducting communication with the absorber element, wherein the absorber element and the nanowire are cooled to a temperature in the range of the transition temperature of the nanowire, wherein the radiation is absorbed by means of the absorber element and wherein it is continuously determined whether the nanowire is in a superconducting state or not, characterized in that energy pulses are continuously supplied to the absorber element by means of a heating means, as long as the nanowire is in the superconducting state and the power which is hereby supplied to the absorber element is determined.

26. A method for determining radiation scattered in an object to be investigated and radiation attenuated in the object to be investigated, wherein the object to be investigated is illuminated by a fan beam with partial beams having different fan angles, wherein by means of a method according to claim 25, a sum of partial beams attenuated in the object to be investigated and radiation scattered in the object to be investigated is measured, wherein the measurement is made in at least one dimension by means of a plurality of detector elements in a spatially resolved manner such that the individual partial beams are spatially resolved.

27. The method according to claim 26, wherein exclusively scattered radiation is measured, wherein the measurement is made in at least one dimension by means of the detector elements in a spatially resolved manner at least at those locations in which with an assumed rotationally symmetrical spatial distribution of the scattered radiation of each partial beam the same proportion of the respective partial beam would be scattered as in a location at which an attenuated partial beam adjacent to the respective partial beam is measured.

28. The method according to claim 27, characterized in that for the locations at which the attenuated partial beams are measured, the exclusively attenuated radiation is computed by subtracting in each case from the measured sum of the attenuated radiation and scattered radiation corresponding parts of the measured exclusively scattered radiation.

29. The apparatus of claim 1 wherein the radiation comprises x-ray radiation.

30. The method of claim 25 wherein the radiation comprises x-ray radiation.

\* \* \* \* \*